United States Patent
Nevo et al.

(10) Patent No.: US 10,984,159 B1
(45) Date of Patent: Apr. 20, 2021

(54) HARDWARE VERIFICATION BASED ON RELATIONS BETWEEN COVERAGE EVENTS

(71) Applicant: International Business Machines Corporation, Armonk, NY (US)

(72) Inventors: Ziv Nevo, Yokneam Elit (IL); Alexander Ivrii, Haifa (IL); Avi Ziv, Haifa (IL); Raviv Gal, Kamon (IL); Haim Kermany, Manof (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/870,994

(22) Filed: May 10, 2020

(51) Int. Cl.
*G06F 30/33* (2020.01)
*G06F 30/398* (2020.01)
*G06F 11/263* (2006.01)
*G06F 11/26* (2006.01)
*G06F 11/36* (2006.01)

(52) U.S. Cl.
CPC ............ *G06F 30/33* (2020.01); *G06F 11/261* (2013.01); *G06F 11/263* (2013.01); *G06F 11/3676* (2013.01); *G06F 30/398* (2020.01)

(58) Field of Classification Search
CPC .... G06F 30/30; G06F 30/3323; G06F 30/398; G06F 11/261; G06F 11/263; G06F 11/3676; G06F 2119/16
USPC ............................................. 716/106; 703/14
See application file for complete search history.

(56) References Cited

U.S. PATENT DOCUMENTS

| | | | |
|---|---|---|---|
| 2006/0156269 A1* | 7/2006 | Hoffman, Jr. | G06F 30/33 716/106 |
| 2009/0006066 A1 | 1/2009 | Behm et al. | |
| 2013/0019216 A1* | 1/2013 | Vasudevan | G06F 30/3323 716/106 |
| 2019/0121932 A1 | 4/2019 | Saunders | |
| 2019/0163600 A1 | 5/2019 | Barak et al. | |

* cited by examiner

*Primary Examiner* — Paul Dinh
(74) *Attorney, Agent, or Firm* — Ziv Glazberg (57) ABSTRACT

A method, and apparatus and a computer program product for determining coverage in hardware verification based on relations between coverage events. The method comprises generating an over-approximation model of the hardware being verified to perform formal verification thereof with respect to a target coverage event being utilized in the verification process along with a set of coverage events. A score indicating an estimated conditional probability to hit the target coverage event in the verification process, given that the coverage event is hit in the verification process, may be determined for each coverage event based on the formal verification. The method further comprises selecting test suits to be executed in the verification process based on the scores and the test suits probability to hit each coverage event. The verification process may be the performed the selected test suits in order to cover the target coverage event.

20 Claims, 4 Drawing Sheets

HARDWARE VERIFICATION BASED ON RELATIONS BETWEEN COVERAGE EVENTS

TECHNICAL FIELD

The present disclosure relates to hardware verification in general, and to determining coverage based on relations between coverage events, in particular.

BACKGROUND

Hardware Verification is a challenging task in silicon development which has a big impact on the key business drivers of quality, schedule and cost. One quality indicator for Hardware Verification process is coverage which is a measure used to describe the degree to which the hardware design is verified when a particular test suite runs. Different coverage models may be applied to check that a given design correctly implements its specification, such as function coverage, statement coverage, control flow edge coverage, branch coverage, condition coverage, or the like (commonly known as structural coverage). Another model is functional coverage which is added manually by the logic designer or the verification engineer, and attempts to capture complex system behaviors, where bugs may hide. As an example a condition where a state machine is in some state while two transactions arrive back-to-back.

In some cases, coverage may be measured as the degree of Hardware Description Language (HDL) code exercised during simulation. Different metrics of the HDL code may be used in hardware verification, such as a line or a block of code (e.g., a sequence of lines with no control branches), branch, expression, and path coverage. Such metrics involve the control flow through the HDL code during simulation and may be described by the Control Flow Graph (CFG) corresponding to that code.

Coverage status is hence an important criterion for many project milestones, such as tape-outs. Coverage closure is the process of advancing coverage goals in general, and the coverage levels specifically. Specifically, understanding the relationship between coverage and test-templates is an important layer in understanding the state and progress of the verification process. Today, this is extremely hard to achieve and is based on expert knowledge.

BRIEF SUMMARY

One exemplary embodiment of the disclosed subject matter is a method comprising: obtaining a target coverage event and a set of coverage events utilized in a verification process of a hardware design, wherein the verification process comprises dynamically executing tests from a test suite to stimulate the hardware design or a simulation thereof; generating an over-approximation model of the hardware design; performing formal verification of the over-approximation model with respect to the target coverage event, whereby obtaining formal results; based on the formal results, determining, for each coverage event in the set of coverage events, a score indicating an estimated conditional probability to hit the target coverage event in the verification process, given that the coverage event is hit in the verification process; selecting a subset of tests from the test suite to execute, wherein said selecting is performed based on a probability of each test of the test suite to hit each coverage event in the set of coverage events and based on the score of the each coverage event; and performing the verification process using the subset of tests in order to cover the target coverage event.

Optionally, said performing the formal verification comprises: identifying coverage events that must be hit before the target coverage event is hit; identifying ordered pairs of coverage events that must be hit before the target coverage event is hit, having a partial order indicating that a first event of the pair is hit before the second event; identifying sets of alternative coverage events, wherein each set of alternative coverage events comprises two or more coverage events of the set of coverage events, wherein at least one of the two or more coverage events must be hit before the target coverage event is hit in the over-approximation model; identifying guiding coverage events with respect to the target coverage event, wherein in the over-approximation model, a shortest route until hitting the target coverage event without hitting the guiding coverage event is larger than a minimal route hitting the target coverage event and the guiding coverage event; and identifying excluding coverage events that cannot be hit by a test that hits the target coverage event in the over-approximation model. Determining the score for each coverage event in the set of coverage events, comprises: determining, based on the partial order, scores for each coverage event that must be hit before the target coverage event is hit, wherein a score of a first event that is ordered after a second event in accordance with the partial order is greater than a score of the second event, wherein a minimal score is determined to one or more events ordered first in accordance with the partial order; determining, for each coverage event in a set of alternative coverage events, a third score, wherein the third score is lower than the minimal score; determining, for a guiding coverage event, a fourth score, wherein the fourth score is lower than the third score, wherein the fourth score is determined based on a difference between a size of the shortest route until hitting the target coverage event when the route has to hit the guiding coverage event and a size of the route hitting the target coverage event without hitting the guiding coverage event; and determining, for each excluding event, a fifth score, wherein the fifth score is lower than the fourth score.

Another exemplary embodiment of the disclosed subject matter is a computerized apparatus having a processor, the processor being adapted to perform the steps of: obtaining a target coverage event and a set of coverage events utilized in a verification process of a hardware design, wherein the verification process comprises dynamically executing tests from a test suite to stimulate the hardware design or a simulation thereof; generating an over-approximation model of the hardware design; performing formal verification of the over-approximation model with respect to the target coverage event, whereby obtaining formal results; based on the formal results, determining, for each coverage event in the set of coverage events, a score indicating an estimated conditional probability to hit the target coverage event in the verification process, given that the coverage event is hit in the verification process; selecting a subset of tests from the test suite to execute, wherein said selecting is performed based on a probability of each test of the test suite to hit each coverage event in the set of coverage events and based on the score of the each coverage event; and performing the verification process using the subset of tests in order to cover the target coverage event.

Yet another exemplary embodiment of the disclosed subject matter is a computer program product comprising a non-transitory computer readable storage medium retaining program instructions, which program instructions when read by a processor, cause the processor to perform a method comprising: obtaining a target coverage event and a set of coverage events utilized in a verification process of a hardware design, wherein the verification process comprises dynamically executing tests from a test suite to stimulate the hardware design or a simulation thereof; generating an over-approximation model of the hardware design; performing formal verification of the over-approximation model with respect to the target coverage event, whereby obtaining formal results; based on the formal results, determining, for each coverage event in the set of coverage events, a score indicating an estimated conditional probability to hit the target coverage event in the verification process, given that the coverage event is hit in the verification process; selecting a subset of tests from the test suite to execute, wherein said selecting is performed based on a probability of each test of the test suite to hit each coverage event in the set of coverage events and based on the score of the each coverage event; and performing the verification process using the subset of tests in order to cover the target coverage event.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

One technical problem dealt with by the disclosed subject matter is to increase the coverage and efficiency of hardware verification. In some exemplary embodiments, hardware designs may be very costly, thus placing stringent requirements on functional validation and verification thereof. Ensuring functional correctness may be a difficult part of designing a hardware system. Moreover, hardware verification may be a complex task, that even though it may consume the most computational resources and time, it may still the weakest link in the design process.

In some exemplary embodiments, in the verification process of a hardware design, some coverage events may be harder to hit, e.g., to cover in verification and some may never be hit during the verification process, e.g., no test-cases covering such events can be found in a reasonable time and sources. Verification teams may spend significant time and effort, trying to cover never-hit or lightly-hit (e.g., hard to hit) coverage events. Maximizing the probability of hitting "hard to hit" or "never hit" coverage events may be essential for increasing the coverage in hardware verification.

In some exemplary embodiments, multiple tests may be generated in order to achieve high coverage, such as in simulation based functional verification, by constrained random methods, Coverage Directed Generation (CDG) methods, or the like. However, large numbers of tests may be required, and some coverage events may still never be hit. In some exemplary embodiments, performing optimization for hitting such events, such as using formal verification tools, may not be feasible.

One technical solution is to understand the pre-condition to hit a certain coverage event, based on relations between other coverage events and the certain coverage event.

In some exemplary embodiments, given a single hard-to-hit coverage event h of a hardware design, a set of easier-to-hit coverage events related to h, such that hitting these events makes the probability of hitting h higher, may be identified. Tests that are hitting easier-to-hit coverage events in the set of related coverage events may have higher probability for hitting h. Tests that are known to hit the related easier-to-hit coverage events in the set of related coverage events may be executed to increase the probability of hitting h.

In some exemplary embodiments, the related easier-to-hit coverage events may be identified using a formal verification tool. The formal verification tool may verify specific properties on an over-approximation model of the hardware design, with free, non-deterministic environment. In some exemplary embodiments, the over-approximation model may be an abstract model of the hardware design instead of the concrete model. As an example, the abstract model may be configured to allows every possible value to every input of the hardware design at every cycle. All properties proved on the abstract model may also be correct on the concrete model. However, some relations may be missed. Additionally or alternatively, less abstract models may accurately model the behavior of several or all inputs and get more accurate results. However, this usually requires much manual work and may increase runtimes later.

In some exemplary embodiments, the formal verification tool may be utilized to determine, for each coverage event c, the property that hitting the coverage event c leads to hitting the hard-to-hit coverage event h. As an example, the property may be "assert {!c[*]}|→{!h}", e.g., if a test does not hit coverage event c, then it may not hit h. If the property is true on the abstract model, then c must be hit before h is hit. This means that hitting coverage event c may increase the probability of hitting hard-to-hit coverage event h. Additionally or alternatively, other properties may be executed in order to find coverage events with weaker relationship to h, coverage events that may never be hit on the same test as h, or the like. In some exemplary embodiments, internal information from formal engines, such as UNSAT cores, may be used to further refine the results. In some exemplary embodiments, a score may be determined for coverage event c. The score may indicate an estimation of the conditional probability to hit hard-to-hit coverage event h in the verification process, given that the coverage event c is hit in the verification process.

Additionally or alternatively, an approximated target function may be defined for the hard-to-hit coverage event. The approximated target function may be defined based on easier-to-hit coverage events having a coverage relation with h (e.g., coverage events that must be hit before the target coverage event). The formal verification tool may be utilized on a Design Under Verification (DUV) of the hardware design, or on the over-approximation model, to determine the coverage relations. In some exemplary embodiments, coverage events that must be hit before the target coverage event is hit identified by the formal verification may be ordered in a partial order indicating the order of being hit. As an example, a first and a second coverage events that must be hit before the target coverage event is hit, such that the first event must be hit before the second event, may be ordered such as the first event is ordered before the second event. Scores for the coverage events that must be hit before the target coverage event, may be determined based on the partial order. A score of a first event that is ordered after a second event in accordance with the partial order is greater than a score of the second event, wherein a minimal score is determined to one or more events ordered first in accordance with the partial order.

Additionally or alternatively, the formal verification tool may be utilized to identify sets of alternative coverage events, each of which comprises two or more coverage events of the set of coverage events, that at least one thereof must be hit before the target coverage event is hit in the over-approximation model. The score determined for each coverage event in a set of alternative coverage events may be lower than the minimal score determined for coverage events that must be hit before the target coverage event.

Additionally or alternatively, the formal verification tool may be utilized to identify guiding coverage events with respect to the target coverage event. A guiding coverage event may be an event that the shortest route to hit the target coverage event without being hit is longer than the shortest route to hit the target coverage event when being hit. Thus hitting a guiding coverage event may ease hitting the target coverage event, as less cycles may be required to hit the hard-to-hit target coverage event if hitting a guiding event, when compared to the number of cycles required to hit the hard-to-hit target coverage event without hitting such events. The score determined for a guiding coverage event, may be lower than the score determined for coverage events in sets of alternative coverage events. Such score may be determined based on a difference between a size of the shortest route until hitting the target coverage event when the route has to hit the guiding coverage event and a size of the route hitting the target coverage event without hitting the guiding coverage event.

Additionally or alternatively, the formal verification tool may be utilized to identify excluding coverage events that cannot be hit by a test that hits the target coverage event in the over-approximation model. The score determined for excluding events may be the lowest score (such as 0). The lowest score may indicate a conditional probability to hit the target coverage event in the verification process, given that a coverage event is hit in the verification process, equals 0.

Additionally or alternatively, each coverage event not assigned with a score, may be provided with a small score greater than the lowest score and lower than a minimal score determined for guiding coverage events In some exemplary embodiments, a subset of tests to be executed for verifying the hardware design, may be selected from the test suite utilized on the verification process. The selection may be performed based on a probability of each test of the test suite to hit each coverage event in the set of coverage events and based on the score of the coverage event. Tests having a high probability to hit coverage events with a high score may be preferred over tests that do not hit such coverage events, or tests that hit coverage events with low scores, or the like. Such determinations may be performed with respect to predetermined thresholds of probabilities and scores defined by a user, based on properties of the hardware design and testing thereof, such as hitting rate, number of hard-to-hit coverage events, number of available tests, or the like. The verification process may be performed using the subset of tests in order to cover the hard-to-hit coverage event h.

It may be noted that according to analysis of real-life hardware designs, a set of related coverage events may exist for any coverage event. As an example, hard-to-hit events that can be hit only under specific design-configuration modes, may have a set of configuration-related coverage events.

One technical effect of utilizing the disclosed subject matter is to reduce the amount of tests required for hardware verification. Relations between coverage events may be used to understand the pre-condition to hit a hard-to-hit coverage event. Test-template maximizing the probability of hitting hard-to-hit coverage events may be identified based hitting related, easier to hit coverage events. As a result, the verification process may be optimized, while reducing time, effort and resources required to cover never-hit or lightly-hit coverage events.

Another technical effect of utilizing the disclosed subject matter is to improve the hit rate of lightly-hit events in automate coverage closure tasks. Tools performing hardware verification that automates coverage closure, usually run tests hitting easily hit events, in the hope that running many tests that frequently hit such events, will improve chances of hitting never-hit events. The ranking system in the disclosed subject matter enables refining the set of related events, to improving the hit rate of the lightly-hit events.

The disclosed subject matter may provide for one or more technical improvements over any pre-existing technique and any technique that has previously become routine or conventional in the art. Additional technical problem, solution and effects may be apparent to a person of ordinary skill in the art in view of the present disclosure.

Figure 1:
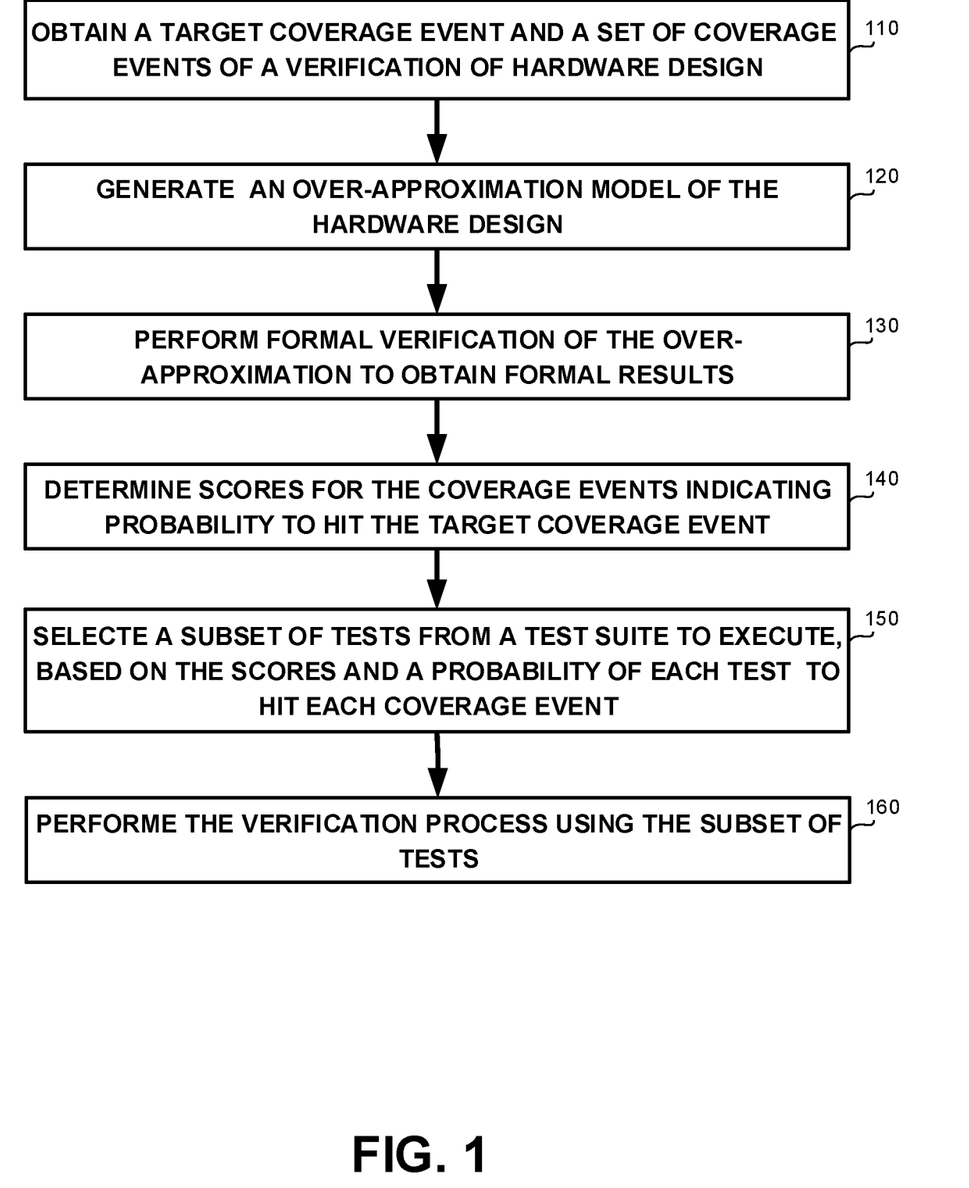
FIG. 1 shows a flowchart diagram of a method, in accordance with some exemplary embodiments of the disclosed subject matter.

Referring now to FIG. 1 showing a flowchart diagram of a method, in accordance with some exemplary embodiments of the disclosed subject matter.

On Step 110, a target coverage event and a set of coverage events may be obtained. The target coverage event and the set of coverage events may be utilized in a verification process of a hardware design. The verification process may comprise dynamically executing tests from a test suite to stimulate the hardware design or a simulation thereof.

In some exemplary embodiments, the target coverage event may be a hard-to-hit coverage event. A hard-to-hit coverage event may be a coverage event having a hit measurement in the verification process below a first predetermined threshold and above a second predetermined threshold. A hit measurement below the second predetermined threshold may be indicative of the target coverage event being unhittable.

On Step 120, an over-approximation model of the hardware design may be generated. In some exemplary embodiments, the over-approximation model may be an abstract model of the hardware design that allows every possible value to every input of the hardware design at every cycle. Additionally or alternatively, the over-approximation may be a less abstract model, that models the behavior of several inputs and provide more accurate results.

On Step 130, formal verification of the over-approximation model may be performed with respect to the target coverage event. In some exemplary embodiments, the formal verification may be configured to prove the correctness of properties on the over-approximation model, such as using a model checker. Formal results may be obtained.

On Step 140, a score for each coverage event in the set of coverage events may be determined based on the formal results. Each score may indicate a conditional probability to hit the target coverage event in the verification process, given that the coverage event is hit in the verification process.

On Step 150, a subset of tests to execute may be selected from the test suite. The selecting may be performed based on a probability of each test of the test suite to hit each coverage event in the set of coverage events and based on the score of the coverage event.

On Step 160, the verification process may be performed using the subset of tests in order to cover the target coverage event.

Figure 2A:
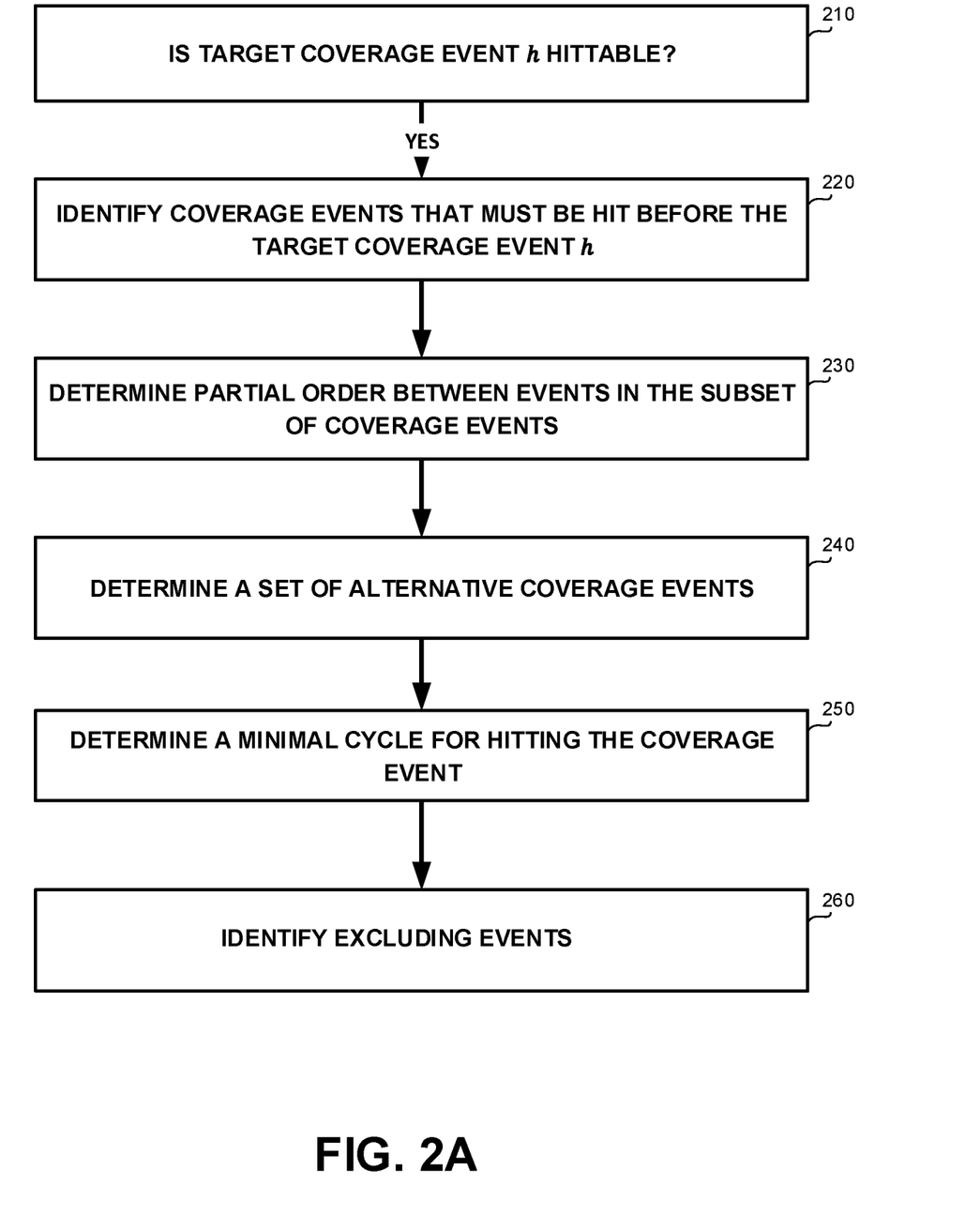
FIG. 2A shows a flowchart diagram of a method, in accordance with some exemplary embodiments of the disclosed subject matter.

Referring now to FIG. 2A showing a flowchart diagram of a method, in accordance with some exemplary embodiments of the disclosed subject matter.

In some exemplary embodiments, the formal verification of the over-approximation model, performed with respect to the target coverage event, may be configured to determine coverage relationship between the target coverage event and the other coverage events from the set of coverage events utilized in the verification process of the hardware design.

On Step 210, a determination whether the target coverage event h is hittable may be performed. The coverage target event may be considered unhittable if a hit measurement thereof in the verification process in a predetermined previous timeframe is below a predetermined threshold. As an example, an event may be considered as a "Never hit" event, if no test hit the event in the recorded history of the verification process. As another example, an event may be considered as an "Aged out" event, if no test hit the event in the last week, last 2 weeks, last month, or the like. In some exemplary embodiments, an aged out event may be determined to be unhittable, based on the timeframe not being hit, such as above on month, or the like. As yet another example, an event may be considered "Lightly covered" if it was hit less than a predetermined number of times, such as 100, 150, 200, or the like; in the last 10 days, in the last two weeks, the last month, or the like.

In some exemplary embodiments, in case the target coverage event h is hittable, a minimal cycle of the over-approximation model in which the target coverage event can be hit, may be calculated.

On Step 220, coverage events that must be hit before the target coverage event h may be identified.

In some exemplary embodiments, a subset of coverage events, each of which is characterized as an event that must be hit before the target coverage event is hit; may be identified. Each coverage event in the subset of coverage events, may be provided with a maximal score, indicating that the probability to hit the target coverage event h, given that the coverage event is hit, is a high probability close to 1 (e.g. $0 \ll p<1$).

On Step 230, a partial order between events in the subset of coverage events, may be determined. In some exemplary embodiments, coverage events in the subset of coverage events identified in Step 220, may be ordered in the partial order according to order of hitting thereof. As an example, a first event may be ordered before a second event if the first event must be hit before hitting the second event in the over-approximation model.

In some exemplary embodiments, the score for each coverage event in the subset of coverage events may be determined based on the partial order therebetween. Referring to the above mentioned example, a first score may be determined for the first event and a second score for the second event. The first score may be lower than the second score. In some exemplary embodiments, the coverage event ordered as the last in the partial order may be assigned with the maximal score, while the other events may be assigned with lower scores in accordance with the partial order.

On Step 240, a set of alternative coverage events may be determined. The set of alternative coverage events may comprise coverage events of the set of coverage events, that at least one thereof must be hit before the target coverage event is hit in the over-approximation model. In some exemplary embodiments, the set of alternative coverage events may be a minimal subset that comprises two or more coverage events. All minimal subsets of alternative coverage events may be extracted, such as engines that find Minimal Unsatisfiable Subsets (MUSes) for SAT.

In some exemplary embodiments, the score of coverage events in the set of alternative coverage events, may be lower than the score provided to other coverage events. In some exemplary embodiments, the score may be determined on the score provided to the must hit coverage event in the subset of alternative coverage events in Step 230. Other coverage events in each subset may be assigned with scores lower than the score provided to the must hit coverage event in the subset of alternative coverage events.

On Step 250, a minimal cycle may be determined for each coverage event in the set of coverage events. Such minimal cycle may be the minimal cycle of the over-approximation model in which the target coverage event can be hit, without hitting the coverage event. In some exemplary embodiments, Step 250 may be performed only on coverage events identified in Step 220; e.g., coverage events that must be hit before the target coverage event h.

In some exemplary embodiments, the score determined for each coverage event may be based on a difference between the length of the minimal cycle of the coverage event and the length of the minimal cycle of the target coverage event determined in Step 210.

On Step 260, one or more excluding events may be identified. An excluding event may be a coverage event that cannot be hit by a test that hits the target coverage event in the over-approximation model.

In some exemplary embodiments, a minimal score may be provided for the excluding events. Tests that hit excluding events may be excluded from tests for the verification of the target coverage event.

Figure 2B:
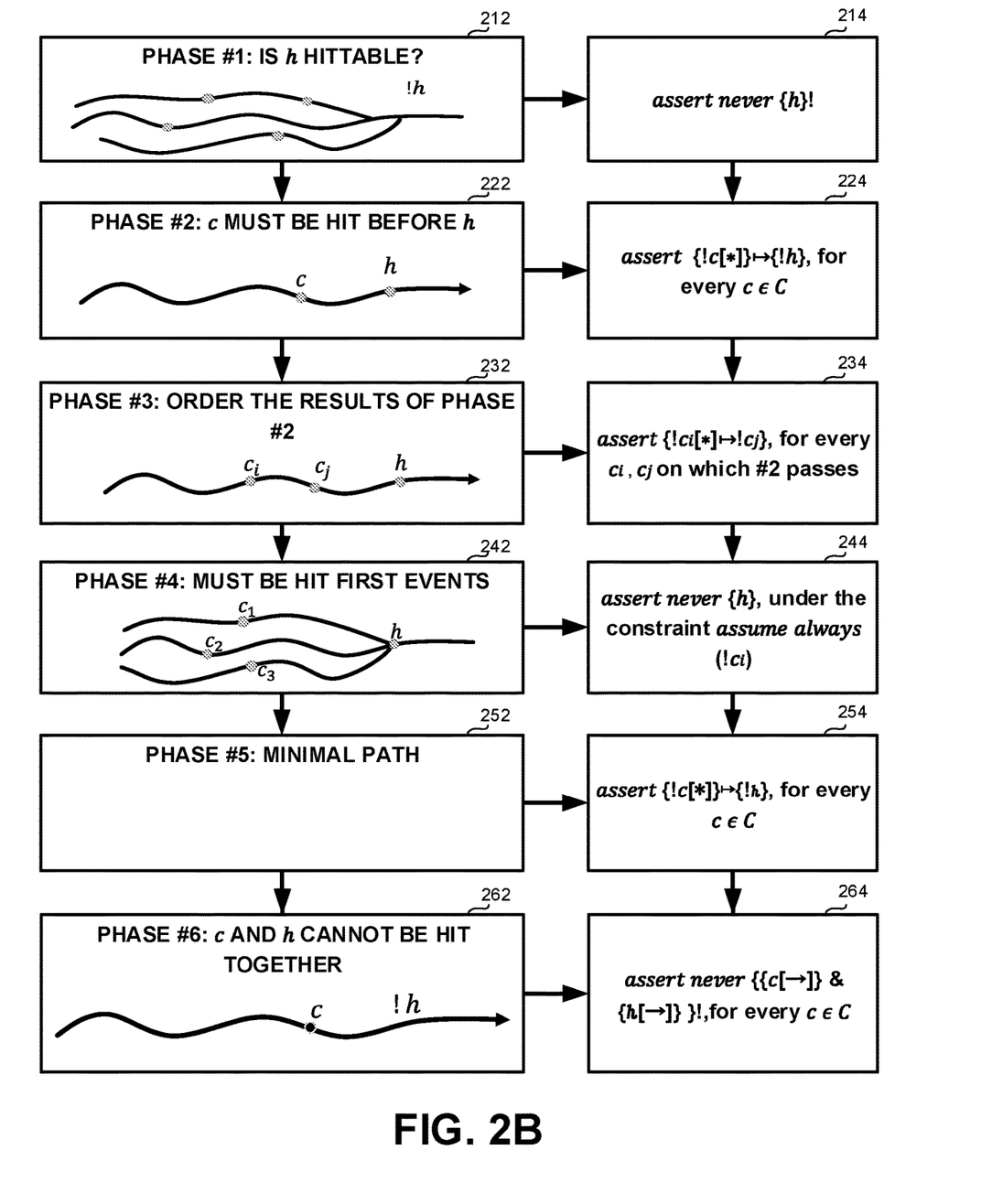
FIG. 2B shows a schematic illustration of exemplary formal verification phases associated with the flowchart diagram of FIG. 2A, in accordance with some exemplary embodiments of the disclosed subject matter.

Referring now to FIG. 2B showing a schematic illustration of exemplary formal verification phases associated with the flowchart diagram of FIG. 2A, in accordance with some exemplary embodiments of the disclosed subject matter.

In some exemplary embodiments, the method shown in FIG. 2A may be performed using a formal verification tool on the DUV of the hardware, using the over-approximation model thereof, e.g., the abstract model allowing "free inputs". The formal verification tool may be utilized to prove or disprove coverage relations (e.g., hitting relations) between the coverage events. The formal verification tool may be configured to check the correctness of intended hitting correspondences between the coverage events, with respect to a certain formal specification or temporal-logic property, using formal methods of mathematics, such as by providing a formal proof on over-approximation model. A model checker may be utilized to provide the formal proof. The model checker may be configured to evaluate all temporal-logic properties on the over-approximation model.

Each property proved on the over-approximation model may be correct on the concrete model of the hardware.

In some exemplary embodiments, the formal verification may be run in phases, each of which checks a different property. The results of one phase may affect the set of properties to run in subsequent phases. The formal verification process may be performed with respect to a target coverage event, h, and a set of coverage events $C=c_1, c_2, \ldots, c_n$, which comprises potential coverage events to be analyzed.

In some exemplary embodiments, analyzing the model checker results from each phase, allows us to rank each event in $c \in C$ according to its likelihood to increase/decrease (when hit) the probability of hitting h. A score function s (c) may be computed for each coverage event, where s(c) may be the system's estimation of the conditional probability of hitting h, given that c was hit. In some exemplary embodiments, a maximal score may be determined for coverage events with the highest conditional probability. As an example, s(c)=1 may indicate that every test hitting c, must also hit h and s(c)=0 means that hitting c zeroes the probability of hitting h. In the following exemplary embodiment, Property Specification Language (PSL) is used to describe the properties. Other implementations may use other languages, such as, System Verilog Assertions (SVA) language or semantically-equivalent proprietary directives of the model-checking tool.

On Phase 1 (212) associated with Step 210, a determination whether the target coverage event h is hittable may be performed. The property (214) provided to the model checker may be assert never[h]!. In some exemplary embodiments, if the target coverage event h is unhittable, then C≡0, e.g., a minimal score, s(c)=0 for every c and the user may be notified that h is an invalid target. Otherwise, a minimal cycle k on which h can be hit, may be determined, such as using Bounded Model Checking.

On Phase 2 (222) associated with Step 220, coverage events that must be hit before the target coverage event h, may be identified. The property (224) assert [!c[*])}|->{!h}, may be executed for every $c \in C$. Each property may be configured to determine if on every path that hits h, c must be hit before h. If for a given c the relevant property passes, then c must be hit before h can be hit. This means that tests hitting c have a higher probability of hitting h than tests that do not (their probability is 0).

On Phase 3 (232) associated with Step 230, a partial order may be induced on coverage events identified in Phase 2. The property (234) assert {!c1[*]}|->{!c2}, may be executed for every c1, c2 for which the properties in Phase 2 passed. If for a given c1, c2 property 234 passes, then c1 must be hit before c2 can be hit. This means that the conditional probability to hit the target coverage event in the verification process, given that the coverage event c1 is hit in the verification process, is lower than the conditional probability to hit the target coverage event in the verification process, given that the coverage event c2 is hit in the verification process. E.g., Pr(h was hit|c1 was hit)≤Pr(h was hit|c2 was hit) because on every test where c2 is hit, then c1 was already hit. Accordingly, the scores of each pair $c_i, c_j$ on which the property passes, may be in accordance with the partial order thereof: $s(c_i) < s(c_j) \Rightarrow c_j$ is "closer" to h.

On Phase 4 (242) associated with Step 240, minimal unsatisfiable subsets may be identified. The property (242) assert never[h]! may be executed under the constraint assume always $\Lambda_{i=1}^n !c_i$. If property 242 passes, minimal unsatisfiable subsets of C that are required to hit h may be identified. This may be implemented using algorithms similar to those that compute all MUSes for SAT. For each such subset, at least one coverage event must be hit before h is hit. Accordingly, hitting any of the coverage events in the subset may increase the probability of hitting h. It may be noted that coverage events found in Phase 2 may not be checked in Phase 4.

On Phase 5 (252) associated with Step 250, a minimal cycle for hitting the target coverage event may be determined. The property (254) assert never{h}! may be executed for every $c \in C$, under a single constraint assume always !ci. Events found on previous phases may be excluded. For each coverage event that property 254 fails, a minimal failure cycle may be determined using bounded model checking. A minimal fail cycle larger than k (the minimal cycle on which h can be hit, determined in Phase 1) may indicate that it would be much easier to hit h if ci is first hit. Hence, hitting ci improves the probability of hitting h.

On Phase 6 (262) associate with Step 260, excluding coverage events may be determined. The property (264) assert never {{c[->]} & {h[->]}}! may be executed for every $c \in C$. If for a given c the property 264 passes, then c and h can never be hit on the same test. This means that tests hitting c have 0 probability of hitting h. Accordingly, a minimal score S(c)=0 may be provided for such events. It may be noted that coverage events found in previous phases may be excluded from this phase.

In some exemplary embodiments, all remaining events, that were not identified in any phase, may be provided with a score ε>0, lower than any other provided score.

Additionally or alternatively, coverage information from recent simulations may be utilized to refine the provided scores. An event c that is frequently hit in recent simulations may be ranked lower than an event that is less frequently. As if c is hit many times without h being hit, hitting it even more may be less likely to increase the probability of hitting h.

Additionally or alternatively, coverage events identified in Phase 2 may be assigned with the highest ranking, such as 1, 100%, or the like. Coverage events identified in Phase 3 may be assigned with ranking in accordance with the partial order on the coverage events identified in Phase 2. Coverage events identified in Phase 4 may be assigned with a lower ranking than coverage events identified in Phase 3. Coverage events identified in Phase 5 may be assigned with a lower ranking than coverage events identified in Phase 4. Coverage events identified in Phase 6 may be assigned with a lowest ranking, such as 0. All remaining coverage events may be assigned with a small ranking ε>0, lower than the ranking determined for coverage events identified in Phase 5.

Figure 3:
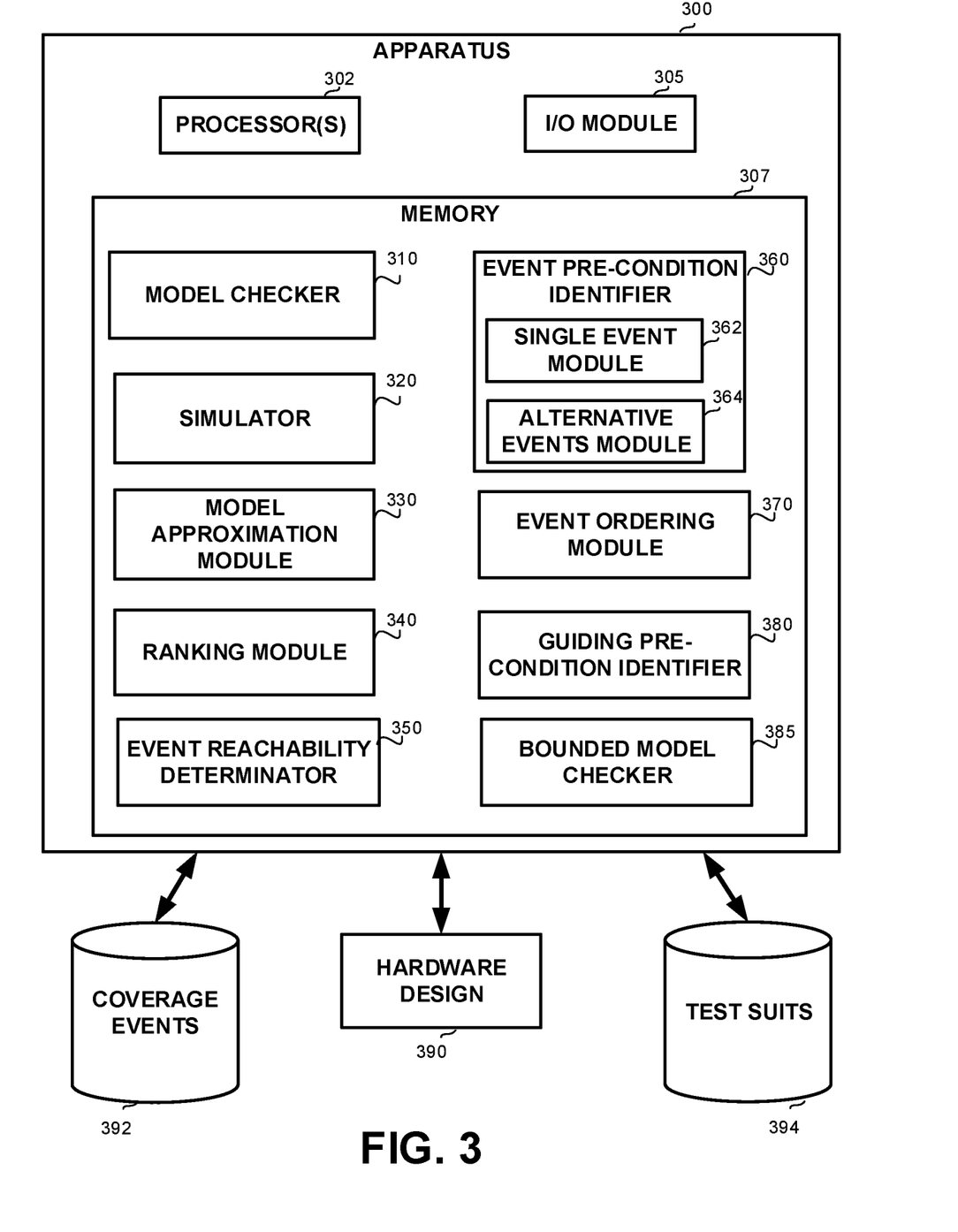
FIG. 3 shows a block diagram of an apparatus, in accordance with some exemplary embodiments of the disclosed subject matter.

Referring now to FIG. 3 showing a block diagram of an apparatus, in accordance with some exemplary embodiments of the disclosed subject matter. An Apparatus 300 may be configured to support parallel user interaction with a real world physical system and a digital representation thereof, in accordance with the disclosed subject matter. In some exemplary embodiments, Apparatus 300 may be configured to perform hardware verification for a hardware design, such as Hardware 390. Apparatus 300 may be configured to execute one or more tests (such as for Test Suit Database 394) in order to test the hardware design.

In some exemplary embodiments, Test Suit Database 394 may comprise template tests aimed at coverage models that target common architecture tasks such as instruction set, address translation, load-store unit, or the like. Additionally or alternatively, Test Suit Database 394 may comprise micro-architecture tests that target common mechanisms, such as pipelines, out-of-order execution, caches, or the like.

Tests in Test Suit Database 394 may be configured according to design-specific parameters of the hardware being tested. Test Suit Database 394 may be continuously being enhanced and extended to cover new tasks and new architecture upgrades.

In some exemplary embodiments, Apparatus 300 may comprise one or more Processor(s) 302. Processor 302 may be a Central Processing Unit (CPU), a microprocessor, an electronic circuit, an Integrated Circuit (IC) or the like. Processor 302 may be utilized to perform computations required by Apparatus 300 or any of it subcomponents.

In some exemplary embodiments of the disclosed subject matter, Apparatus 300 may comprise an Input/Output (I/O) module 305. I/O Module 305 may be utilized to provide an output to and receive input from a user, such as, for example properties of the hardware being tested, concrete model thereof, related coverage events, or the like.

In some exemplary embodiments, Apparatus 300 may comprise Memory 307. Memory 307 may be a hard disk drive, a Flash disk, a Random Access Memory (RAM), a memory chip, or the like. In some exemplary embodiments, Memory 307 may retain program code operative to cause Processor 302 to perform acts associated with any of the subcomponents of Apparatus 300.

In some exemplary embodiments, Apparatus 300 may obtain (such as via I/O Module 305) a target coverage event and a set of coverage events utilized in a verification process of Hardware Design 390. The target coverage event and a set of coverage events may be obtained from Coverage Events Database 392 associated with Hardware Design 390.

In some exemplary embodiments, the verification process may comprise dynamically executing tests from a test suite (obtained from Test Suits Database 394 or determined based thereon) to stimulate Hardware Design 390 or a simulation thereof.

In some exemplary embodiments, Model Approximation Module 330 may be configured to generate an over approximation model of Hardware Design 390. The over approximation model may be generated as an abstraction of Hardware Design 390, such as enabling all possible values to every input of Hardware Design 390 at every cycle, abstracting a portion of the inputs of Hardware Design 390, or the like. It may be noted that all coverage events in Hardware Design 390 may be synthesized into logic gates.

In some exemplary embodiments, Model Checker 310 may be configured to check various temporal-logic properties related to the coverage events. Model Checker 310 may be configured to evaluate the properties on the over approximation model of Hardware Design 390 generated by Model Approximation Module 330. In some exemplary embodiments, Model Checker 310 may be configured to utilize a Simulator 320 to perform formal verification of the over-approximation model with respect to the target coverage event.

In some exemplary embodiments, the properties may be divided into phases. Each property or set of properties may be proved on a different phase. The results of one phase may affect the set of properties to run in subsequent phases.

In some exemplary embodiments, the formal results determined by Model Checker 310 from each phase may be analyzed. Ranking Module 340 may be configured to determine, based on the analysis of the formal results, a score for each coverage event in the set of coverage events. Each score may indicate a conditional probability to hit the target coverage event in the verification process, given that the coverage event is hit in the verification process. E.g., Ranking Module 340 may be configured to rank each coverage event in the set of coverage events, according to its likelihood to increase or decrease the probability of hitting target coverage event when being hit.

In some exemplary embodiments, Apparatus 300, or a user (not shown) thereof, such as verification team member, hardware designer, or the like, may select a subset of tests from the test suite to execute for the verification of Hardware Design 390. The selection may be performed based on a probability of each test of the test suite to hit each coverage event in the set of coverage events and based on the score of the coverage event. As an example, tests having a probability above a predetermined threshold (such as above 0.8, above 0.9, or the like), to hit coverage events having a score above a predetermined threshold score (such as above 0.5, above 0.7, or the like), may be selected. The verification process may be performed using the subset of tests in order to cover the target coverage event.

In some exemplary embodiments, Event Reachability Determinator 350 may be configured to determine whether the target coverage event is hittable. Event Reachability Determinator 350 may utilize Model Checker 310 and Simulator 320 to run a property checking whether the target coverage event is hittable, such as assert never{h}!. In case Event Reachability Determinator 350 determines that the target coverage event is unhittable, then Ranking Module 340 may assign a zero score indicating zero probability to hit the target coverage event in the verification process (even given that the coverage event is hit). Additionally or alternatively, in case Event Reachability Determinator 350 determines that the target coverage event is hittable, Bounded Model Checker 385 may be utilized to determine a minimal cycle of the over-approximation model in which the target coverage event can be hit.

In some exemplary embodiments, Event Pre-Condition Identifier 360 may be configured to identify coverage events that must be hit before the target coverage event is hit. In some exemplary embodiments, Event Pre-Condition Identifier 360 may deploy Single Event Module 362, to identify single "must be hit" coverage events. Single Event Module 362 may utilize Model Checker 310 and Simulator 320 to run a property for each coverage event, checking whether the coverage event must be hit before the target coverage event. The property may be assert {!c[*]}|->{!h}, for every coverage event c in the set of coverage events. If the property passes, then the associated coverage event may be considered as a "must be hit" event. Accordingly, tests hitting such coverage events may have a higher probability of hitting the target coverage event.

Additionally or alternatively, Event Pre-Condition Identifier 360 may be configured to identify subsets of coverage events that must be hit before the target coverage event is hit. Ranking Module 340 may be configured to provide highest scores for "must be hit" coverage events and for coverage event being included in "must be hit" subset of coverage events.

Additionally or alternatively, Event Pre-Condition Identifier 360 may deploy Alternative Events Module 364 to determine sets of alternative coverage events, which comprises two or more coverage events hit together; that at least one thereof must be hit before the target coverage event is hit in the over-approximation model. In some exemplary embodiments, Alternative Events Module 364 may utilize Model Checker 310 and Simulator 320 to run a property for each coverage event, checking whether the coverage event must be hit before the target coverage event. The property may be assert {!h}, under the constraint assume always $\Lambda_{i=1}^{n} !c_i$, to identify all minimal unsatisfiable subsets of set of target events, that are required to hit the target coverage event. In some exemplary embodiments, Alternative Events Module 364 may exclude the results of Single Event Module 362.

In some exemplary embodiments, the formal results of Event Pre-Condition Identifier 360 may be provided to Ranking Module 340 in order to determine scores for the identified coverage events therein. Coverage events identified as "must be hit" coverage events may be assigned with a highest score. Alternative coverage events comprised by sets of alternative may be assigned with lower scores, such as the highest score −0.1, the highest score −0.05, or the like.

In some exemplary embodiments, Event Ordering Module 370 may be configured to determine a partial order between coverage events identified by Event Pre-Condition Identifier 360. The partial order may order a first event before a second event if the first event must be hit before hitting the second event in the over-approximation model. This means that the probability to hit the target coverage event, given that the first event is hit is lower than the probability to hit the target coverage, given that the second event is hit. Event Ordering Module 370 may utilize Model Checker 310 and Simulator 320 to run a property assert $\{!c_i[*]\}|->\{!c_j\}$ for every $c_i$, $c_j$ identified by Event Pre-Condition Identifier 360 as "must be hit" coverage events.

In some exemplary embodiments, Ranking Module 340 may be configured to determine scores for the coverage events identified by Event Pre-Condition Identifier 360 based on the partial order determined by Event Ordering Module 370. As an example, Ranking Module 340 may determine a first score for the first event, and a second score for the second event, such that the first score is lower than the second score.

In some exemplary embodiments, Guiding Pre-Condition Identifier 380 may be configured to identify coverage events that hitting thereof is more complicated than hitting the target coverage event. In some exemplary embodiments, Guiding Pre-Condition Identifier 380 may utilize Bounded Model Checker 385, to determine, for each coverage event in the set of coverage event, a minimal cycle of the over-approximation model in which the target coverage event can be hit, without hitting the coverage event. Coverage events having minimal cycle larger than the minimal cycle of the target coverage event may be determined as guiding events that tests hitting thereof may ease hitting the target coverage event. It may be noted the coverage events identified by Event Reachability Determinator 350 or Event Pre-Condition Identifier 360 may be excluded from being analyzed by Guiding Pre-Condition Identifier 380. Ranking Module 340 may be configured to determine scores for such guiding events based on a difference between the length of the minimal cycle of the guiding coverage event and the length of the minimal cycle of the target coverage event.

Additionally or alternatively, Guiding Pre-Condition Identifier 380 may be configured to determine excluding events that cannot be hit by a test that hits the target coverage event in the over-approximation model. Guiding Pre-Condition Identifier 380 may utilize Model Checker 310 and Simulator 320 to run a property assert never$\{\{c[->]\}$ & $\{h[->]\}\}!$ for every coverage event. Ranking Module 340 may be configured to determine a minimal score for excluding events.

Additionally or alternatively, Ranking Module 340 may be configured to determine a first score for coverage events that must be hit before the target coverage event is hit, identified by Event Pre-Condition Identifier 360. Additionally or alternatively, Ranking Module 340 may be configured to determine a second score for the first event in the each ordered pair, ordered by Event Ordering Module 370. The second score may be lower than the score determined for the second event in the each ordered pair, and lower than the first coverage event. Additionally or alternatively, Ranking Module 340 may be configured to determine a third score for coverage events comprised by a set of alternative coverage events identified by Alternative Events Module 364. The third score may be lower than a lowest second score determined for a first event in an ordered pair. Additionally or alternatively, Ranking Module 340 may be s configured to determine a forth score for each harder (e.g., guiding) coverage event, determined by Guiding Pre-Condition Identifier 380. The forth score may be lower than the third score. The forth score of may be correlated with a difference between the minimal cycle of the harder coverage event and the minimal cycle of the target coverage event. Additionally or alternatively, Ranking Module 340 may be configured to determine a fifth score for each excluding event that cannot be hit with the target coverage event. The fifth score may be lower than the forth score. In some exemplary embodiments, the fifth score may be the lowest score that can be provided, such as 0. Additionally or alternatively, Ranking Module 340 may be configured to determine a sixth score for each coverage event not assigned with a score. The sixth score may be lower than forth score and greater than the fifth score. As an example, the sixth score may be a small score $\varepsilon > 0$.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
    obtaining a target coverage event and a set of coverage events utilized in a verification process of a hardware design, wherein the verification process comprises dynamically executing tests from a test suite to stimulate the hardware design or a simulation thereof;
    generating an over-approximation model of the hardware design;
    performing formal verification of the over-approximation model with respect to the target coverage event, whereby obtaining formal results;
    based on the formal results, determining, for each coverage event in the set of coverage events, a score indicating an estimated conditional probability to hit the target coverage event in the verification process, given that the coverage event is hit in the verification process;

selecting a subset of tests from the test suite to execute, wherein said selecting is performed based on a probability of each test of the test suite to hit each coverage event in the set of coverage events and based on the score of the each coverage event; and performing the verification process using the subset of tests in order to cover the target coverage event.

2. The method of claim 1, wherein the target coverage event is a hard-to-hit coverage event.

3. The method of claim 2, wherein the hard-to-hit coverage event is a coverage event having a hit measurement in the verification process below a first predetermined threshold and above a second predetermined threshold, wherein a hit measurement below the second predetermined threshold indicates that the target coverage event is unhittable.

4. The method of claim 1,
determining a minimal cycle of the over-approximation model in which the target coverage event can be hit, whereby determining a first minimal length;
wherein said performing the formal verification comprises:
determining, for each coverage event in the set of coverage event, a minimal cycle of the over-approximation model in which the target coverage event can be hit, without hitting the each coverage event, whereby determining for the each coverage event a second minimal length; and
wherein said determining the score for each coverage event in the set of coverage events comprises determining the score based on a difference between the second minimal length of the each coverage event and the first minimal length.

5. The method of claim 1,
wherein said performing the formal verification comprises: determining a subset of coverage events, each of which is characterized as an event that must be hit before the target coverage event is hit;
wherein said determining the score for each coverage event in the set of coverage events, is based on the each coverage event being included in the subset of coverage events.

6. The method of claim 5,
wherein said performing the formal verification comprises determining a partial order between events in the subset of coverage events, wherein the partial order orders a first event before a second event if the first event must be hit before hitting the second event in the over-approximation model;
wherein said determining the score for each coverage event in the set of coverage events is further based on the partial order between the events in the subset of coverage events.

7. The method of claim 6, wherein the said determining the score comprises determining a first score for a first event and determining a second score for a second event, wherein the first event and the second event are comprised by the subset of coverage events, wherein the partial order orders the first event before the second event, wherein the first score is lower than the second score.

8. The method of claim 1,
wherein said performing the formal verification comprises determining a set of alternative coverage events, wherein the set of alternative coverage events comprises two or more coverage events of the set of coverage events, wherein at least one of the two or more coverage events must be hit before the target coverage event is hit in the over-approximation model;

wherein said determining the score for each coverage event in the set of coverage events, is based on the each coverage event being included in the set of alternative coverage events.

9. The method of claim 1,
wherein said performing the formal verification comprises determining an excluding event, wherein the excluding event is a coverage event that cannot be hit by a test that hits the target coverage event in the over-approximation model;
wherein said determining the score for each coverage event in the set of coverage events, comprises: determining a minimal score for the excluding event, whereby said selecting excludes tests hitting the excluding event from the subset of tests.

10. The method of claim 1,
wherein said performing the formal verification comprises:
identifying coverage events that must be hit before the target coverage event is hit;
identifying ordered pairs of coverage events that must be hit before the target coverage event is hit, having a partial order indicating that a first event of the pair is hit before the second event;
identifying sets of alternative coverage events, wherein each set of alternative coverage events comprises two or more coverage events of the set of coverage events, wherein at least one of the two or more coverage events must be hit before the target coverage event is hit in the over-approximation model;
identifying guiding coverage events with respect to the target coverage event, wherein in the over-approximation model, a shortest route until hitting the target coverage event without hitting the guiding coverage event is larger than a minimal route hitting the target coverage event and the guiding coverage event; and
identifying excluding coverage events that cannot be hit by a test that hits the target coverage event in the over-approximation model;
wherein said determining the score for each coverage event in the set of coverage events, comprises:
determining, based on the partial order, scores for each coverage event that must be hit before the target coverage event is hit, wherein a score of a first event that is ordered after a second event in accordance with the partial order is greater than a score of the second event, wherein a minimal score is determined to one or more events ordered first in accordance with the partial order;
determining, for each coverage event in a set of alternative coverage events, a third score, wherein the third score is lower than the minimal score;
determining, for a guiding coverage event, a fourth score, wherein the fourth score is lower than the third score, wherein the fourth score is determined based on a difference between a size of the shortest route until hitting the target coverage event when the route has to hit the guiding coverage event and a size of the route hitting the target coverage event without hitting the guiding coverage event; and
determining, for each excluding event, a fifth score, wherein the fifth score is lower than the fourth score.

11. The method of claim 10, wherein the fifth score is a lowest score determined for a coverage event, wherein the fifth score indicates an estimated conditional probability to hit the target coverage event in the verification process, given that a coverage event with the fifth score is hit in the verification process, equals 0.

12. The method of claim 10,
   wherein said determining the score for each coverage event in the set of coverage events, further comprises:
   for each coverage event not assigned with a score, determining a sixth score, wherein the sixth score is lower than fourth score and greater than the fifth score.

13. A computerized apparatus having a processor, the processor being adapted to perform the steps of:
   obtaining a target coverage event and a set of coverage events utilized in a verification process of a hardware design, wherein the verification process comprises dynamically executing tests from a test suite to stimulate the hardware design or a simulation thereof;
   generating an over-approximation model of the hardware design;
   performing formal verification of the over-approximation model with respect to the target coverage event, whereby obtaining formal results;
   based on the formal results, determining, for each coverage event in the set of coverage events, a score indicating an estimated conditional probability to hit the target coverage event in the verification process, given that the coverage event is hit in the verification process;
   selecting a subset of tests from the test suite to execute, wherein said selecting is performed based on a probability of each test of the test suite to hit each coverage event in the set of coverage events and based on the score of the each coverage event; and
   performing the verification process using the subset of tests in order to cover the target coverage event.

14. The computerized apparatus of claim 13, wherein the target coverage event is a hard-to-hit coverage event, wherein the hard-to-hit coverage event is a coverage event having a hit measurement in the verification process below a first predetermined threshold and above a second predetermined threshold, wherein a hit measurement below the second predetermined threshold indicates that the target coverage event is unhittable.

15. The computerized apparatus of claim 13,
   wherein said performing the formal verification comprises:
      determining a subset of coverage events, each of which is characterized as an event that must be hit before the target coverage event is hit; and
      determining a partial order between events in the subset of coverage events, wherein the partial order orders a first event before a second event if the first event must be hit before hitting the second event in the over-approximation model;
   wherein said determining the score for each coverage event in the set of coverage events, is based on the each coverage event being included in the subset of coverage events, and based on the partial order between the events in the subset of coverage events, wherein said determining the score comprises determining a first score for a first event and determining a second score for a second event, wherein the first event and the second event are comprised by the subset of coverage events, wherein the partial order orders the first event before the second event, wherein the first score is lower than the second score.

16. The computerized apparatus of claim 13,
   wherein said performing the formal verification comprises determining a set of alternative coverage events, wherein the set of alternative coverage events comprises two or more coverage events of the set of coverage events, wherein at least one of the two or more coverage events must be hit before the target coverage event is hit in the over-approximation model;
   wherein said determining the score for each coverage event in the set of coverage events, is based on the each coverage event being included in the set of alternative coverage events.

17. The computerized apparatus of claim 13,
   wherein said performing the formal verification comprises determining an excluding event, wherein the excluding event is a coverage event that cannot be hit by a test that hits the target coverage event in the over-approximation model;
   wherein said determining the score for each coverage event in the set of coverage events, comprises: determining a minimal score for the excluding event, whereby said selecting excludes tests hitting the excluding event from the subset of tests.

18. The computerized apparatus of claim 13,
   wherein said performing the formal verification comprises:
      identifying coverage events that must be hit before the target coverage event is hit;
      identifying ordered pairs of coverage events that must be hit before the target coverage event is hit, having a partial order indicating that a first event of the pair is hit before the second event;
      identifying sets of alternative coverage events, wherein each set of alternative coverage events comprises two or more coverage events of the set of coverage events, wherein at least one of the two or more coverage events must be hit before the target coverage event is hit in the over-approximation model;
      identifying guiding coverage events with respect to the target coverage event, wherein in the over-approximation model, a shortest route until hitting the target coverage event without hitting the guiding coverage event is larger than a minimal route hitting the target coverage event and the guiding coverage event; and
      identifying excluding coverage events that cannot be hit by a test that hits the target coverage event in the over-approximation model;
   wherein said determining the score for each coverage event in the set of coverage events, comprises:
      determining, based on the partial order, scores for each coverage event that must be hit before the target coverage event is hit, wherein a score of a first event that is ordered after a second event in accordance with the partial order is greater than a score of the second event, wherein a minimal score is determined to one or more events ordered first in accordance with the partial order;
      determining, for each coverage event in a set of alternative coverage events, a third score, wherein the third score is lower than the minimal score;
      determining, for a guiding coverage event, a fourth score, wherein the fourth score is lower than the third score, wherein the fourth score is determined based on a difference between a size of the shortest route until hitting the target coverage event when the route has to hit the guiding coverage event and a size of the route hitting the target coverage event without hitting the guiding coverage event; and
      determining, for each excluding event, a fifth score, wherein the fifth score is lower than the fourth score.

19. A computer program product comprising a non-transitory computer readable storage medium retaining program instructions, which program instructions when read by a processor, cause the processor to perform a method comprising:
- obtaining a target coverage event and a set of coverage events utilized in a verification process of a hardware design, wherein the verification process comprises dynamically executing tests from a test suite to stimulate the hardware design or a simulation thereof;
- generating an over-approximation model of the hardware design;
- performing formal verification of the over-approximation model with respect to the target coverage event, whereby obtaining formal results;
- based on the formal results, determining, for each coverage event in the set of coverage events, a score indicating an estimated conditional probability to hit the target coverage event in the verification process, given that the coverage event is hit in the verification process;
- selecting a subset of tests from the test suite to execute, wherein said selecting is performed based on a probability of each test of the test suite to hit each coverage event in the set of coverage events and based on the score of the each coverage event; and
- performing the verification process using the subset of tests in order to cover the target coverage event.

20. The computer program product of claim 19, wherein said performing the formal verification comprises:
- identifying coverage events that must be hit before the target coverage event is hit;
- identifying ordered pairs of coverage events that must be hit before the target coverage event is hit, having a partial order indicating that a first event of the pair is hit before the second event;
- identifying sets of alternative coverage events, wherein each set of alternative coverage events comprises two or more coverage events of the set of coverage events, wherein at least one of the two or more coverage events must be hit before the target coverage event is hit in the over-approximation model;
- identifying guiding coverage events with respect to the target coverage event, wherein in the over-approximation model, a shortest route until hitting the target coverage event without hitting the guiding coverage event is larger than a minimal route hitting the target coverage event and the guiding coverage event; and
- identifying excluding coverage events that cannot be hit by a test that hits the target coverage event in the over-approximation model;

wherein said determining the score for each coverage event in the set of coverage events, comprises:
- determining, based on the partial order, scores for each coverage event that must be hit before the target coverage event is hit, wherein a score of a first event that is ordered after a second event in accordance with the partial order is greater than a score of the second event, wherein a minimal score is determined to one or more events ordered first in accordance with the partial order;
- determining, for each coverage event in a set of alternative coverage events, a third score, wherein the third score is lower than the minimal score;
- determining, for a guiding coverage event, a fourth score, wherein the fourth score is lower than the third score, wherein the fourth score is determined based on a difference between a size of the shortest route until hitting the target coverage event when the route has to hit the guiding coverage event and a size of the route hitting the target coverage event without hitting the guiding coverage event; and
- determining, for each excluding event, a fifth score, wherein the fifth score is lower than the fourth score.

* * * * *